United States Patent
Conway et al.

(10) Patent No.: US 8,325,776 B2
(45) Date of Patent: Dec. 4, 2012

(54) PLASMON STABILIZED LASER DIODES

(75) Inventors: Joshua A. Conway, Redondo Beach, CA (US); Jon V. Osborn, Thousand Oaks, CA (US); Ryan A. Stevenson, Maple Valley, WA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 13/189,412

(22) Filed: Jul. 22, 2011

(65) Prior Publication Data

US 2011/0280273 A1 Nov. 17, 2011

Related U.S. Application Data

(63) Continuation of application No. 11/978,253, filed on Oct. 29, 2007, now Pat. No. 8,009,716.

(51) Int. Cl.
*H01S 5/00* (2006.01)
(52) U.S. Cl. .......... 372/49.01; 372/98; 372/99; 372/102
(58) Field of Classification Search ............... 372/49.01, 372/98, 99, 102
See application file for complete search history.

(56) References Cited

U.S. PATENT DOCUMENTS

| | | |
|---|---|---|
| 6,501,783 B1 | 12/2002 | Capasso et al. |
| 6,680,799 B1 | 1/2004 | Parriaux et al. |
| 7,280,578 B2 | 10/2007 | Mizutani et al. |
| 2004/0131102 A1 | 7/2004 | Jett et al. |
| 2008/0267236 A1 | 10/2008 | Sigalas et al. |
| 2009/0110021 A1 | 4/2009 | Conway et al. |

FOREIGN PATENT DOCUMENTS

WO WO 2007071794 A2 * 6/2007

* cited by examiner

*Primary Examiner* — Yuanda Zhang
(74) *Attorney, Agent, or Firm* — Paul D. Chancellor, Ocear Law

(57) ABSTRACT

A device having a light cavity includes, at one end, a plasmonic reflector having a grating surface for coupling incoming light into traverse plasmon waves and for coupling the traverse plasmon wave into broaden light, the surface serving to redistribute light within the cavity, the reflector being well suited for use in laser diodes for redistributing filamental cavity laser light into spatially broaden cavity laser light for translating multimodal laser light into unimodal laser light for improved reliability and uniform laser beam creation.

15 Claims, 1 Drawing Sheet

MODE SPOILING PLASMONIC LASER

PLASMON STABILIZED LASER DIODES

PRIORITY CLAIM

This application is a continuation of U.S. patent application Ser. No. 11/978,253 filed Oct. 29, 2007 now U.S. Pat. No. 8,009,716 and entitled PLASMON STABILIZED UNIMODAL LASER DIODES.

BACKGROUND OF THE INVENTION

1. Field of the Invention

The invention relates to the fields of multimodal laser diodes and passive plasmonic devices. More particularly, the present invention relates to a laser diode facet that employs plasmonic coupling to laterally redistribute the laser light.

2. Discussion of the Related Art

There has been recent progress in the guiding and focusing of light beyond the diffraction limit through the use of surface plasmons. Because of the potentials afforded by greatly increasing the optical energy density, plasmonic technology advances have created a new field known as plasmonics. There is a good deal of significant prior art with most of the work relating to applications such as near-field optical microscopy, surface enhanced Raman spectroscopy, heat-assisted magnetic recording, and optical data storage. The prior art specifically relating to patterning of metal films on the facets of laser diodes also exists. A. Partovi, et. al., teaches a "High-power laser light source for near-field optics and its application to high-density optical data storage," in, Appl. Phys Lett., vol. 75, no. 11, pp. 1515-1517, 1999. F. Chen, et. al., teaches "Imaging of optical field confinement in ridge waveguides fabricated on very-small-aperture laser," in Appl. Phys Lett., vol. 83, no. 16, pp. 3245-3247, 2003. E. Cubukcu, et. al., teach a "Plasmonic laser antenna," in Appl. Phys Lett., vol. 89, pp. 093120-1-3, 2006. These efforts were directed to increasing the near-field intensity by focusing plasmonic waves at a single location on the facet of single-lateral-mode laser diodes.

Nanorods have been grown on a surface to control an index of refraction. J. Q. Xi et. al., teaches "Optical thin-film materials with low refractive index for broadband elimination of Fresnel reflection.", in Nature Photonics, vol. 1, pp. 176-179, 2007. This technology is used to create a spatially graded index which would allow for wide-band antireflection coatings. In addition to nanorods, plasmonic Bragg gratings have been disclosed. A. Boltasseva et al., teaches "Compact Bragg Gratings for Long-Range Surface Plasmon Polaritons," in the Journal of Lightwave Technology, v. 24, no. 2, pp. 912-918, 2006. A Bragg grating was used to reflect plasmonic waves of various frequencies. Thus, the plasmon is the input that hits the plasmonic grating, and plasmons of certain frequencies are reflected while other plasmons are transmitted. This Bragg grating functioned entirely in the plasmonic regime. Plasmonic gratings have also been made with very high efficiency of plasmon generation, while uncoupled light is specularly reflected as in the conventional optical facet. Prior art Bragg gratings are disadvantageously limited to the plasmonic regime without the ability to expand, shape, or manipulate the modes of the plasmons.

The conventional high power laser diode does not fill its laser gain cavity during standard operation. Instead, the optical mode forms a filament due to the optical and gain dynamics of the device. The position of this lasing filament is not static but rather moves through the device, creating multimodal hot-spots and thermal lenses which accelerate failure of the device. These and other disadvantages are solved or reduced using the invention.

SUMMARY OF THE INVENTION

An object of the invention is to provide a plasmonic reflector in a laser diode.

Another object of the invention is to distribute laser light in a laser diode.

Yet another object of the invention is to provide a unimodal laser.

Still another object of the invention is to provide a high reliability diode laser.

A further object of the invention is to distribute an electrical field in a laser diode to distribute laser light generation within the laser diode.

The invention is directed to a large-area laser having a plasmonic reflector. The plasmonic reflector redistributes the lateral mode profile within the laser diode to advantageously reduce the potential for filamented or confined lasing and the consequential hot spots within the laser diode. The plasmonic reflector serves to control the diffusion of the optical field, by redistribution, as being diametrically opposed to the focusing, for mode spoilage or mode expansion, or both. The reflector is preferably a patterned metal film disposed in a multi-transverse-mode laser diode for the purposes of redistributing the reflected light for controlling both spatial, polarization and spectral parameters of the laser light. The reflector is used for generating free-space laser exit beams by expanding, shaping, or manipulating the laser light within the laser diode.

The plasmonic optical reflector can employ a nano scale conductive surface, allowing control of both spectral and spatial reflectivity properties. The reflector can stabilize the cavity modes of multi-mode, high-power laser diodes. In one embodiment, the invention sits behind the high-reflectivity facet of a multi-mode, high-power laser diode, which is patterned with metal films such that the near-field optical radiation can be spatially and temporally stabilized. A reflective facet consisting of a nano scale structured conductor selectively redistributes the spatial profile of the optical energy upon reflection. These patterned metal films may consist of nanorods, corrugated surfaces, round holes, square holes, or other patterns having subwavelength structures. The metal film serves as an optical antenna to redistribute and homogenize the optical radiation across the facet of the laser, or other resonant optical device, to better fill the laser cavity with laser light. By patterning the facet of a multimode, high-power laser diode with arrays of metallic nano-structures, deleterious effects, such as filamentation and catastrophic optical mirror damage may be mitigated. More importantly, subwavelength control of the optical field of the laser diode allows for manipulation of the standing wave optical modes throughout the cavity for control of the modal distributions, output brightness, and light losses. Subwavelength control serves as a mode spoiler or mode shaper, as well as a control over the polarization properties of the mode. The subwavelength control minimizes random generation of localized hot spots at the facets and within the cavities for improving high-power laser diodes reliability. These and other advantages will become more apparent from the following detailed description of the preferred embodiment.

DETAILED DESCRIPTION OF THE PREFERRED EMBODIMENTS

Figure 1:
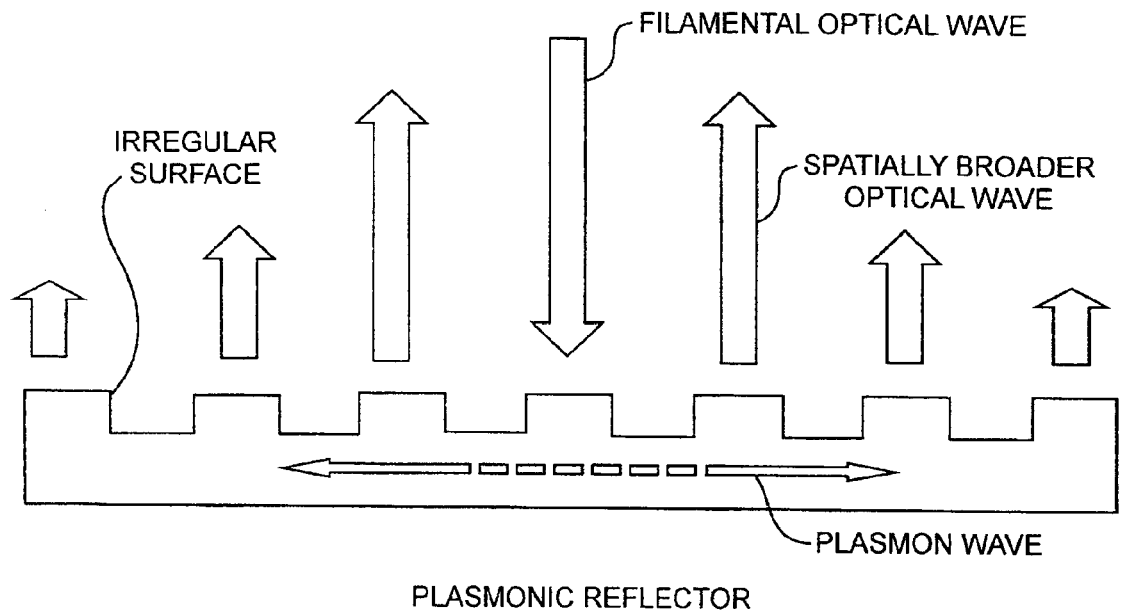
FIG. 1 depicts a plasmonic reflector.

An embodiment of the invention is described with reference to the figures using reference designations as shown in the figures. Referring to FIG. 1, a plasmonic reflector has a reflective grating surface that may be, for example, a square wave irregular surface of regularly spaced raised and lower portions. The irregular surface is a grating surface. The reflector receives a filamental optical wave and generates a traverse plasmon wave extending traversely through the reflector orthogonal to the incoming filamental optical wave. After traversely traveling, the plasmon wave out-couples into a spatially broader optical wave as a reflection. As such, the reflector serves to redistribute the optical wave from a narrow multimodal filamental optical wave to a spatially broader optical wave. A broadened optical wave filling the laser cavity is referred to as unimodal. The effect of the plasmonic reflector is to translate fine multimodal operation into broad unimodal operation. A spatially localized optical filament, shown with dimensions exaggerated for convenience, is incident upon the plasmonic reflector. A portion of this filament is specularly reflected, as would be the case for a standard metal reflecting surface. The remaining portion of the incident wave is coupled into surface plasmons due to the corrugated structure of the reflector. These plasmons propagate normal to the incident filament and are out-coupled into free space optical waves. This broadens the incident filament upon reflection.

Figure 2:
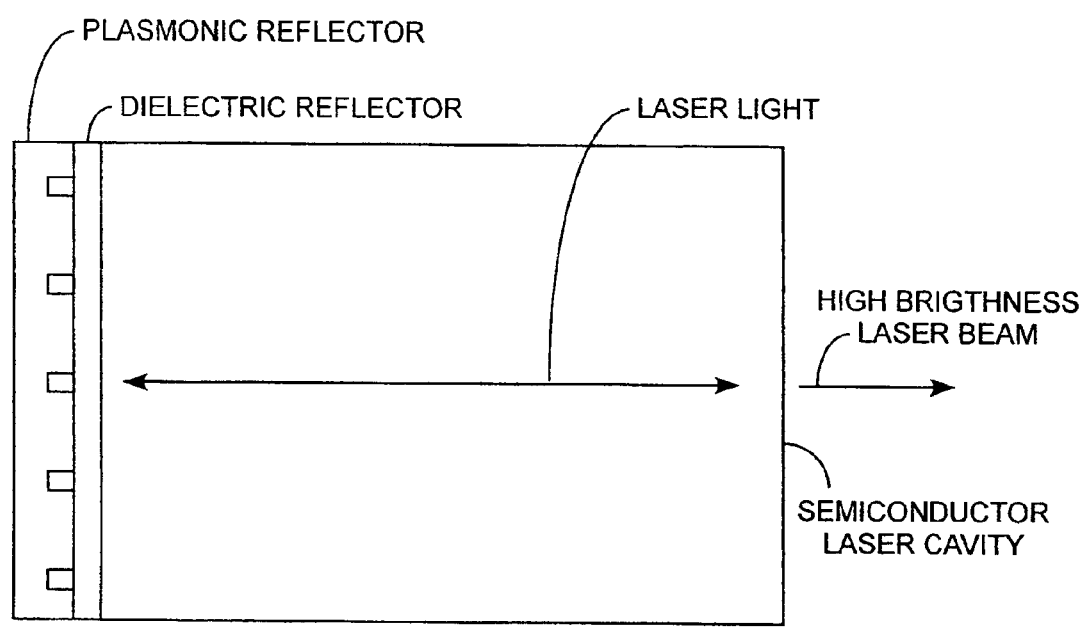
FIG. 2 depicts a mode spoiling plasmonic laser.

Referring to FIGS. 1 and 2, and more particularly to FIG. 2, the plasmonic reflector is positioned on the high-reflectivity facet of a conventional semiconductor laser. The plasmonic reflector is preferably disposed on a dielectric reflector of a convention laser. Because metals generally cannot dissipate the energy absorbed in intense optical fields, the plasmonic reflector is located behind the conventional high-reflectivity dielectric coating. There are many possible methods of fabricating this reflector on the back of a laser diode, including photolithographic patterning followed by an anisotropic etch and metal deposition, or by a simple focused ion beam etch followed by metal deposition. The plasmonic laser has internal laser light within a semiconductor laser cavity. The laser light has been spatially broadened within the laser cavity. The reflector couples the normally incident optical fields into plasmons which will propagate traversely along the surface of the metal plasmonic reflector at high reflective facet end. The plasmonic reflector serves to broaden the optical light through plasmon and optical coupling. The coupling is firstly from the filamental optical wave to the traverse plasmonic wave. The coupling is secondly from the transverse plasmonic wave to the broadened optical wave. The optical and plasmonic coupling can be accomplished by many different plasmonic reflector designs, such as the use of a plasmonic grating reflector. A grating with 25% efficiency can be used to couple light from the plasmon wave to a normal free space wave. By varying the grating depth and period of the irregular surface, the exact coupling efficiency is determined by engineering parameters that can be set to optimize the laser performance. The traverse plasmon wave will propagate normally to the incident radiation and along the metal surface. Because the laws of physics are reversible and time-invariant, the same grating which coupled light into the plasmonic field will couple that field back out into the laser cavity. In so doing, the plasmon wave laterally redistributes the reflected beam and spread the optical energy to homogenize the optical power distribution within the cavity. Surface plasmons are uniquely suited for redistribution because plasmonic wave vectors may be greater than those of the free-space optical field. Because of the greater wave vectors, the gratings of the plasmonic reflector can be constructed which only couples surface plasmons for reducing modes of the laser cavity.

The dielectric reflector defines a back facet of the laser diode that is covered by a metal film that has been preferably patterned with an array of nano structured features. The fabrication of the irregular surface can be done in a variety of ways. For example, a thin metal film is electron-beam evaporated or sputtered onto the facet of the device. The metal film could be of any variety of metals that are known to support and guide surface plasmons. The conductive metals such as copper, gold, aluminum and silver may be used. The metal film is then patterned on the nanometer scale. The metal film may be a directly deposited e-beam film that could form nano-structured droplets of metal forming the desired irregular grating surface of the plasmonic reflector. The grating surface can also be made done etching patterns into a metal film or an underlying dielectric film. Such etching can be done using focused ion beams, nano-imprint lithography, or by any other lithographic or patterning methods that can obtain nanometer resolution. Alternately, the metal film could be deposited by a focused ion beam into the desired pattern. Direct write deposition would eliminate the need for a separate etching step.

The metal film can be patterned in various geometries. In the preferred embodiment, a one or two dimensional grating can be etched into the underlying dielectric film of the facet followed by evaporation of a metal film. The grating would serve to couple light from the laser cavity to surface plasmon modes of the metal film. Because the wave-vector of surface plasmons is greater than that of free space light of the same frequency, the grating could be constructed such that the grating would only couple from normally incident radiation into plasmons, and then from the plasmons back into the cavity optical modes. The grating structure would then mitigate losses because the grating is then only capable of scattering between the plasmonic modes and cavity optical modes. Therefore, scattering to modes outside the cavity is eliminated. The grating could be chirped or optimally patterned so that points of high optical intensity at the periphery of the facet are directed towards the center of the facet. With proper design and modeling, an optimal end-facet geometric structure can be realized that controls and more evenly distributes the optical intensity within the cavity, while spoiling any single preferential spatial mode, within a multimode laser cavity. Alternatively, the underlying facet grating surface can be roughened with gallium beams using focused ion beam deposition. A thin metal film is evaporated onto that roughened surface. The rough metal film couples the light in the laser cavity to surface plasmon modes in the metal through a matching of the wave vector. In the reverse process, the surface plasmon wave can reradiate light back into the laser cavity for redistributing the optical light.

The invention is directed to an optical device having a cavity through which optical light is passed but having a modified optical mode using a plasmonic reflector for spatially redistributing intensity profiles well suited for high-power laser diodes end facets. In a broad aspect, the device is used for redistributing optical light using an optical cavity having two ends. The reflector at one end is for receiving the light as incoming light and for emitting the light as exiting light. The reflector has a surface for coupling the received light into a traverse plasmon wave. The surface is further for coupling the plasmon wave into the exiting light communicated through the cavity to the second end.

Preferably, the device is a laser for generating laser light with the reflector receiving incoming light as filamental laser light and providing exiting light that is broadened laser light. The optional dielectric film is disposed between the reflector and the cavity for electrically isolating the reflector from the cavity. In the preferred form, the reflector surface is a grating. The grating is made from a conducting metal. Plasmonic reflectors can be used for improving beam quality, reliability, and robustness of a device having an optical cavity, such as broad-area laser diodes. The plasmonic reflector modifies the lateral optical mode profile of an optical device, such as a laser or resonator. The mode profile can be controlled through the incorporation of a plasmonic reflector having nanostructured metal films. The nanostructured film functions by coupling the incoming radiation into modes of the metal which propagate energy perpendicular to the axis of the device cavity. These modes can be either traveling wave modes or coupled resonators, both of which serve to redistribute optical energy. The same mechanism which in-couples the light into the modes of the metal also serves to out-couple it back into the cavity, only now it has been translated by some engineered length. This would homogenize the energy distribution and minimize the build-up of hot-spots and could spoil higher order modes or undesired polarizations. These nanostructures could be implemented as arrays of nano-particles, square or round holes in a continuous metal film, a roughened surface coated with a thin metal, a one-dimensional or two-dimensional grating structure, quantum dots, and other structures having dimensions less that the wavelength of laser light. Various plasmonic reflector gratings can be used to redistribute optical light within a device cavity. Those skilled in the art can make enhancements, improvements, and modifications to the invention, and these enhancements, improvements, and modifications may nonetheless fall within the spirit and scope of the following claims.

What is claimed is:

1. A device for spreading optical light, the device comprising:
    a multi-transverse mode laser including a lasing cavity;
    a first end of the lasing cavity next to a high reflectivity dielectric reflector;
    a second end of the lasing cavity for emitting light;
    the first and second ends of the cavity lying in substantially parallel planes;
    the high-reflectivity dielectric reflector interposed between the lasing cavity first end and a plasmonic reflector;
    the plasmonic reflector for receiving light as incoming light and for emitting the light as exiting light;
    a reflective grating of the plasmonic reflector next to the high reflectivity dielectric reflector;
    the reflective grating for coupling the incoming light into a transverse plasmon wave; and,
    the reflective grating further for coupling the plasmon wave into the exiting light communicated through the cavity to the second end.

2. The device of claim 1 wherein the device is a laser, the light is laser light, the incoming light is filamental light, and the exiting light is spatially broadened light.

3. The device of claim 1, wherein the reflective grating includes a film deposit on an irregular surface.

4. The device of claim 1, wherein the plasmonic reflector incorporates a conducting metal selected from the group consisting of gold, copper, aluminum, and silver.

5. The device of claim 1, wherein the plasmonic reflector is made of metal and the reflective grating comprises structures smaller than the wavelength of the laser light.

6. The device of claim 1, wherein a plasmonic reflector surface is made of features selected from the group consisting of lines, dots, and bumps.

7. The device of claim 1, wherein the device is a laser, the laser is a plasmonic laser, the light is laser light, the incoming light is filamental laser light, and the exiting light is spatially broadened laser light.

8. The device of claim 7, wherein the plasmonic reflector incorporates a metal.

9. The device of claim 7, wherein the plasmonic reflector incorporates one or more of copper, gold, aluminum and silver metal.

10. A device for reducing laser light filamentation, the device comprising:
    a multi-transverse mode laser including a lasing cavity;
    a first end of the lasing cavity next to a high reflectivity dielectric reflector;
    a second end of the lasing cavity for emitting light;
    the first and second ends of the cavity lying in substantially parallel planes;
    the high-reflectivity dielectric reflector interposed between the lasing cavity first end and a plasmonic reflector;
    the plasmonic reflector for receiving light as incoming light and for emitting the light as exiting light;
    a reflective grating of the plasmonic reflector next to the high reflectivity dielectric reflector;
    the reflective grating for coupling the incoming light into a transverse plasmon wave;
    the transverse plasmon wave operative to reduce laser light filamentation by spatially redistributing light; and,
    the reflective grating further for coupling the plasmon wave into the exiting light communicated through the cavity to the second end.

11. A device for reducing laser hot spots, the device comprising:
    a multi-transverse mode laser including a lasing cavity;
    a first end of the lasing cavity next to a high reflectivity dielectric reflector;
    a second end of the lasing cavity for emitting light;
    the first and second ends of the cavity lying in substantially parallel planes;
    the high-reflectivity dielectric reflector interposed between the lasing cavity first end and a plasmonic reflector;
    the plasmonic reflector for receiving light as incoming light and for emitting the light as exiting light;
    a reflective grating of the plasmonic reflector next to the high reflectivity dielectric reflector;
    the reflective grating for coupling the incoming light into a transverse plasmon wave;
    the transverse plasmon wave operative to reduce laser hot spots; and,
    the reflective grating further for coupling the plasmon wave into the exiting light communicated through the cavity to the second end.

12. The device of claim 11 wherein the device is a laser diode.

13. The device of claim 12 further including a diode facet incorporating the high reflectivity dielectric reflector.

14. The device of claim 13 wherein the diode is a high-power diode.

15. A high power laser diode comprising:
    a multi-transverse mode laser including a lasing cavity;
    a first end of the lasing cavity including a diode facet incorporating a high reflectivity dielectric reflector;
    a second end of the lasing cavity for emitting light;
    the first and second ends of the cavity lying in substantially parallel planes;
    the high-reflectivity dielectric reflector interposed between the lasing cavity and a plasmonic reflector;

the plasmonic reflector operative to receive light as incoming light and to emit the light as exiting light;
a reflective grating of the plasmonic reflector adjacent to the high reflectivity dielectric reflector; and,
wherein localized hot spots are reduced when the reflective grating couples incoming light into a transverse plasmon wave and couples the plasmon wave into the exiting light communicated through the cavity to the second end.

* * * * *